(12) United States Patent
Bartley et al.

(10) Patent No.: US 9,207,275 B2
(45) Date of Patent: Dec. 8, 2015

(54) INTERCONNECT SOLDER BUMPS FOR DIE TESTING

(71) Applicant: International Business Machines Corporation, Armonk, NY (US)

(72) Inventors: Gerald K. Bartley, Rochester, MN (US); Philip R. Germann, Oronoco, MN (US); William P. Hovis, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 348 days.

(21) Appl. No.: 13/715,225

(22) Filed: Dec. 14, 2012

(65) Prior Publication Data

US 2014/0167808 A1 Jun. 19, 2014

(51) Int. Cl.
*G01R 31/26* (2014.01)
*G01R 31/28* (2006.01)
(Continued)

(52) U.S. Cl.
CPC ............ *G01R 31/2884* (2013.01); *H01L 22/32* (2013.01); *H01L 24/11* (2013.01); *H01L 24/14* (2013.01); *G01R 31/26* (2013.01); *G01R 31/2898* (2013.01); *H01L 24/13* (2013.01); *H01L 2224/1146* (2013.01); *H01L 2224/1184* (2013.01); *H01L 2224/11472* (2013.01); *H01L 2224/11849* (2013.01); *H01L 2224/11906* (2013.01); *H01L 2224/13111* (2013.01);
(Continued)

(58) Field of Classification Search
CPC ........... H01L 2224/16227; H01L 2225/06513; H01L 2924/014; H01L 22/34; G01R 31/2884

USPC ..................................................... 324/762.03
See application file for complete search history.

(56) References Cited

U.S. PATENT DOCUMENTS 5,886,362 A * 3/1999 Millican et al. ................. 257/48
6,267,650 B1 * 7/2001 Hembree ......................... 451/49
(Continued)

FOREIGN PATENT DOCUMENTS

| EP | 1074844 A2 | 7/2001 |
|---|---|---|
| JP | 2000223819 A | 8/2000 |
| WO | 2006100746 A1 | 9/2006 |

OTHER PUBLICATIONS

Kim et al., "Through-Mask Electrodeposition of Metals and Alloys for Wafer-Level Packaging Applications", Chip Scale Review Magazine, Mar. 2004. www.chipscalereview.com/issues/0304/article.php?type=feature&article=f5.

(Continued)

*Primary Examiner* — Jermele M Hollington
*Assistant Examiner* — Christopher McAndrew
(74) *Attorney, Agent, or Firm* — Penny L. Lowry; Robert Williams

(57) ABSTRACT

A semiconductor chip may include a die having one or more circuits. The semiconductor chip may include a plurality of die bumps, each having a first geometry, a first vertical profile, and a first volume. The die bumps may be coupled to the die and in electrical communication with the one or more circuits. The semiconductor device may include a plurality of test bumps each having a second geometry, a second vertical profile, and the first volume. The test bumps may be coupled to the die and in electrical communication with the one or more circuits. The first geometry and the second geometry may be adapted for the plurality of test bumps to make connection with a wafer probe to the test bumps without making a connection to any of the die bumps during a die test.

19 Claims, 6 Drawing Sheets

(51) Int. Cl.
  *H01L 21/66* (2006.01)
  *H01L 23/00* (2006.01)

(52) U.S. Cl.
  CPC .............. *H01L2224/1403* (2013.01); *H01L 2224/14051* (2013.01)

(56) References Cited

U.S. PATENT DOCUMENTS

| | | | |
|---|---|---|---|
| 6,559,527 B2 | 5/2003 | Brofman et al. | |
| 6,642,626 B2* | 11/2003 | Park | 257/778 |
| 6,656,750 B1* | 12/2003 | Datta et al. | 438/14 |
| 7,221,173 B2 | 5/2007 | Bachman et al. | |
| 2001/0015495 A1 | 8/2001 | Brofman et al. | |
| 2004/0217769 A1* | 11/2004 | DiOrio | 324/754 |
| 2005/0051903 A1* | 3/2005 | Ellsberry et al. | 257/777 |
| 2007/0023910 A1* | 2/2007 | Beddingfield | 257/738 |
| 2007/0040282 A1* | 2/2007 | Jung et al. | 257/780 |
| 2007/0085187 A1* | 4/2007 | Sun et al. | 257/686 |
| 2007/0234563 A1* | 10/2007 | Sakaguchi et al. | 29/843 |
| 2008/0036065 A1* | 2/2008 | Brunnbauer et al. | 257/686 |
| 2008/0054455 A1* | 3/2008 | Tsao et al. | 257/737 |
| 2009/0057896 A1* | 3/2009 | Su | 257/738 |
| 2009/0071710 A1* | 3/2009 | Stelzl et al. | 174/520 |
| 2011/0278056 A1 | 11/2011 | Takeuchi et al. | |

OTHER PUBLICATIONS

Vahakangas et al., "Chapter B: Flip Chip Technology, Sections: B1. Level 1. Introduction to Flip-Chip Techniques and B2. Level 2. Guidelines", IVF—Swedish Institute of Production Engineering Research. extra.ivf.se/ngi/B-Flip-Chip/ChapterB.htm.

"Computer and Peripherals (Semiconductor)", High Connection Density, Inc., © 2011 HCD, Inc. www.hcdcorp.com/cms.php?mlinkid=33&mlink=Markets&cmsid=67.

* cited by examiner

INTERCONNECT SOLDER BUMPS FOR DIE TESTING

FIELD

The present invention relates to die testing and more particularly to solder bump structures for die testing.

BACKGROUND

Flip chip or controlled collapse chip connection (C4) is a method of interconnecting semiconductor chips to external circuitry using solder bumps that have been deposited onto chip pads of wafers. Each wafer is made up of a plurality of die that have a plurality of solder bumps. The chip pads of the die are lined up with chip pads of the external devices where they are to be connected and the solder is reflowed to complete the interconnect. Prior to interconnecting the die to other devices, the dies may be tested with a wafer probe having a plurality of probe points that probe test circuits for each die at the specific test solder bumps.

SUMMARY

In an embodiment, a semiconductor chip is described. The semiconductor chip may include a die having one or more circuits. The semiconductor chip may include a plurality of die bumps, each having a first geometry, a first vertical profile, and a first volume. The die bumps may be coupled to the die and in electrical communication with the one or more circuits. The semiconductor device may include a plurality of test bumps each having a second geometry, a second vertical profile, and the first volume. The test bumps may be coupled to the die and in electrical communication with the one or more circuits. The first geometry and the second geometry may be adapted for the plurality of test bumps to make connection with a wafer probe to the test bumps without making connection to any of the die bumps during a die test.

In another embodiment, a semiconductor device is described. The semiconductor device may include a plurality of die bumps, each having a first geometry, a first vertical profile, and a first volume. The die bumps may be coupled to the die and in electrical communication with the one or more circuits. The semiconductor device may include a plurality of test bumps each having a second geometry, a second vertical profile, and a second volume. The test bumps may be coupled to the die and in electrical communication with the one or more circuits. The second vertical profile of the test bumps is greater than the first vertical profile of the die bumps.

In yet another embodiment, a method for testing semiconductor devices is described herein. The method includes forming a plurality of die bumps each having a first geometry, a first vertical profile, and a first volume to a die of the semiconductor chip with one or more circuits. The die bumps are in electrical communication with the one or more circuits. A plurality of test bumps are formed having a second geometry, a second vertical profile, and the first volume to the die. The test bumps are in electrical communication with the one or more circuits. The first geometry and second geometry of the plurality of test bumps is adapted to make connection with a wafer probe to the test bumps without making connection to any of the die bumps during a die test. The method may also include testing the die (or multiple die) at the plurality of test bumps with a wafer probe.

BRIEF DESCRIPTION OF THE DRAWINGS

Embodiments will be better understood from the following detailed description with reference to the drawings, in which.

In the drawings and the Detailed Description, like numbers generally refer to like components, parts, steps, and processes.

DETAILED DESCRIPTION

Semiconductor chip fabrication may include forming a plurality of circuits on semiconductor wafers. Each wafer may have multiple copies of the circuits on the wafer. Each of the copies, referred to as die, may be separated in a further step in the semiconductor chip fabrication process. The semiconductor chip may connect the integrated circuits within the die to other external integrated circuits by flip chip or controlled collapse chip connection (C4), which are a methods of interconnecting semiconductor chips to external circuitry using solder bumps that have been deposited onto chip pads of die and electronically coupled to the circuits in the die. The chip pads of the die are lined up with chip pads of the external devices where they are to be connected and the solder is reflowed to complete the interconnect.

Prior to die preparation, testing of all the circuits may be done by a wafer probe to test for functioning die. More than one die may be tested at the same time with a wafer probe. The wafer probe may test the circuits of the die at the solder bumps. The solder bumps where the wafer probe tests the circuits of the die may be referred to as test bumps. The solder bumps not used for testing may be referred to as die bumps. When testing the circuits with the wafer probe, a limitation to the density of the wafer probe is the proximity of the test bumps to the die bumps. In order to limit shorting that may occur when the wafer probe is placed onto the wafer and to accommodate the probe pitch or to avoid connections with the die bumps when trying to test the test bumps, the test bump locations within the solder bump pattern may be spread out from the die bumps to allow a clean probe connection.

In addition, the shrinking solder bump pitch (the distance between the solder bump centers and currently 185.6 µm or less) has forced the added requirement of removing die bumps from the pattern that are adjacent to the test bumps. The removal of adjacent die bumps is required to eliminate shorting with the wafer probe. This limitation may drive added complexity to the solder bump pattern by forcing test bumps to be at a larger minimum pitch than desired. Die bump removal may also impact the efficiency of on-chip circuit placement by forcing test circuits to be placed near the test bumps and therefore impacting placement and timing of functional circuits. Removing die bumps may increase dies size, increase package connections, and degrade the performance of the parts. Embodiments, herein, may include die bumps adjacent to the test bumps that may not short with or make connections with the wafer probe when probing the test bumps. Embodiments may include test bumps that do not require the removal of adjacent die bump. Also, embodiments may allow for uniform pitch between the solder bumps. Substantially uniform pitch may be about +/−5% of the mean pitch between the solder bumps.

Figure 1A:
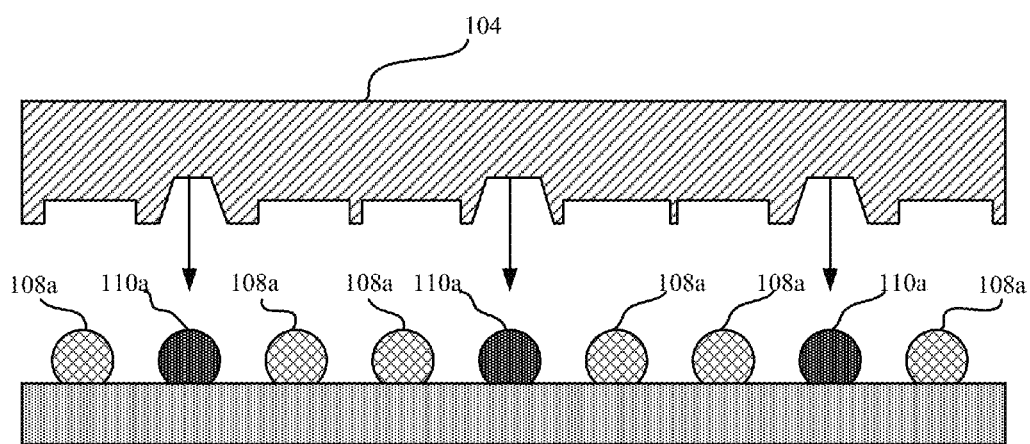
FIG. 1A is a cross-sectional view of a semiconductor chip with reflow solder bumps utilizing a die press to form test bumps according to an embodiment.

In one embodiment, FIG. 1A illustrates a cross-sectional view of a semiconductor chip 102 with reflowed solder bumps utilizing a die press 104 to form test bumps 110. The semiconductor chip 102 may further include a die 106 that has a plurality of die bumps 108a and test bumps 110a on the die 106. Each die bump 108a and test bump 110a may be made of solder or an equivalent material that may be shaped and reflowed to return to a spherical shape. The die bumps 108a and test bumps 110a may be coupled to the die 106 by bump pads (not illustrated), which may be in electrical communication with the circuits or back-end of line (BEOL) wiring (not illustrated) in the die 106. Each die bump 108a and test bump 110a may have substantially the same volume of solder material. Substantially the same volume may be about +/−5% of the mean volume of the solder bumps.

The die press 104 may be used to shape the die bumps 108a and test bumps 110a. The die press 104 may be formed to make the test bumps 110a taller than all the die bumps 108a or the die bumps 108a that are adjacent to the test bumps 110a. The temperature environment that the die press operates in may be at an elevated temperature than ambient temperature. However, the temperature may be below the reflow temperature of the bump material. The elevated temperature may make it easier to achieve the solder bump reshaping. The die press 104 may make the die bumps 108a have a first geometry and a first vertical profile. The die press 104 may make the test bumps 110a have a second geometry and a second vertical profile that may be taller than the first vertical profile of the die bumps 108a. The volume of the die bumps 108a and the test bumps 110a may be substantially the same after the die press 104 has formed the new solder bump geometries. Making test bumps 110a taller and with different geometries than the die bumps 108a may prevent shorting or inadvertent connections of the wafer probe with adjacent die bumps 108a when testing the die 106. If a retest is required, then a reflow and a re-forming with the die press 104 may be performed.

Figure 1B:
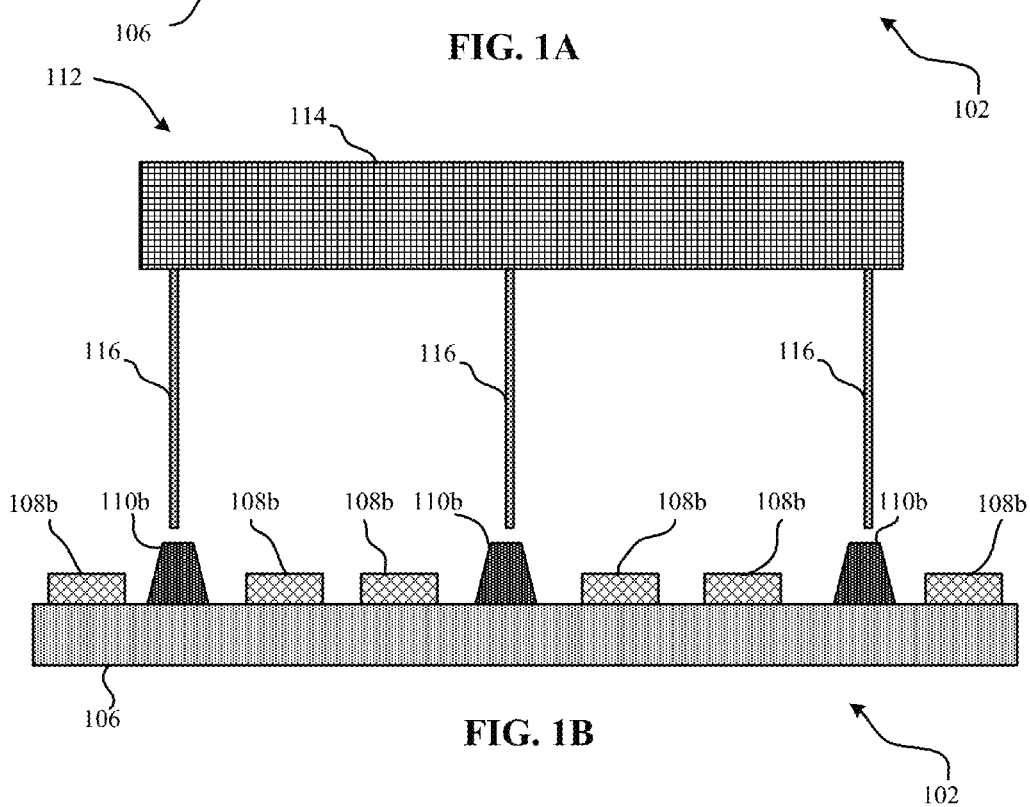
FIG. 1B is a cross-sectional view of the semiconductor chip with test bumps utilizing the die press method according to an embodiment.

FIG. 1B illustrates the semiconductor chip 102 after the die press 104 has formed the die bumps 108b and test bumps 110b. FIG. 1B may include a wafer probe 112 and the semiconductor chip 102. The wafer probe 112 may include a wafer substrate 114 and a plurality of probe points 116. The test bumps 110b and the die bumps 108b may be shaped in a way that distinguishes the test bumps 110b from the die bumps 108b during wafer final testing (WFT). The die bumps 108b may have the first geometry and the first vertical profile. The test bumps 110b may have the second geometry with the second vertical profile. The second vertical profile may be taller than the first vertical profile. The first geometry in FIG. 1 may be polyhedron, while the second geometry may be a pyramidal frustum. However, other geometries that limit wafer probe shorting are contemplated for either the first or second geometries. After WFT the test bumps 110b and the die bumps 108b may be reflowed into their original spherical shape by melting the bumps 108b and 110b. Reflowing may return the pressed die and test bumps 108b and 110b into a sphere, each containing substantially the same volume.

Figure 2A:
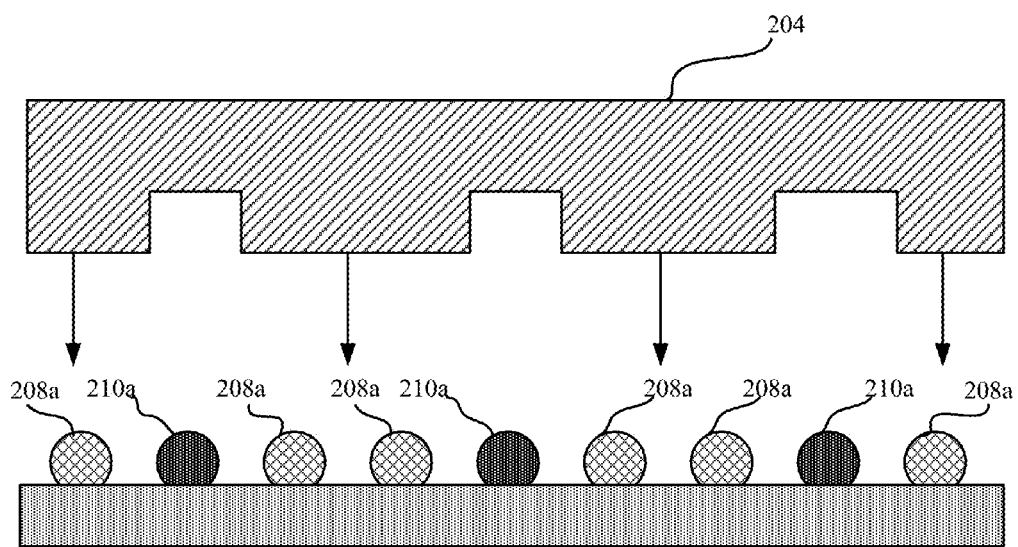
FIG. 2A is a cross-sectional view of the semiconductor chip with reflow solder bumps utilizing a force compressed process to form test bumps according to an embodiment.

FIG. 2A illustrates another embodiment of a cross-sectional view of a semiconductor chip 202 utilizing force compression to distinguish test bumps 210a from die bumps 208a. FIG. 2A includes a flat press 204 and a semiconductor chip 202. The semiconductor chip 202 may include a plurality of test bumps 210a and die bumps 208a on a die 206. The test bumps 210a and die bumps 208a may be coupled to the die 206 at die pads. These die pads may be in electrical communication with the BEOL wiring in the die 206. The test bumps 210a and die bumps 208a may be substantially the same volume and spherical shape when reflowed. The flat press may be adapted to press the die bumps 208a adjacent to the test bumps 210a while leaving the test bumps 210a and other non-adjacent die bumps with substantially the same shape before the force compression. In another embodiment, the flat press 204 may be adapted to flatten all die bumps 208a while leaving the test bumps 210a in their original, flowed, spherical shape. An application force of up to 155 grams under the acceleration of gravity on the die bumps 208a may significantly deform the die bumps 208a without damaging the underlying BEOL wiring of the die 202. The temperature that the force compression process occurs may be at an elevated temperature than ambient temperature. However, the temperature may be below the reflow temperature of the bump material. The elevated temperature may make it easier to achieve the solder bump reshaping.

Figure 2B:
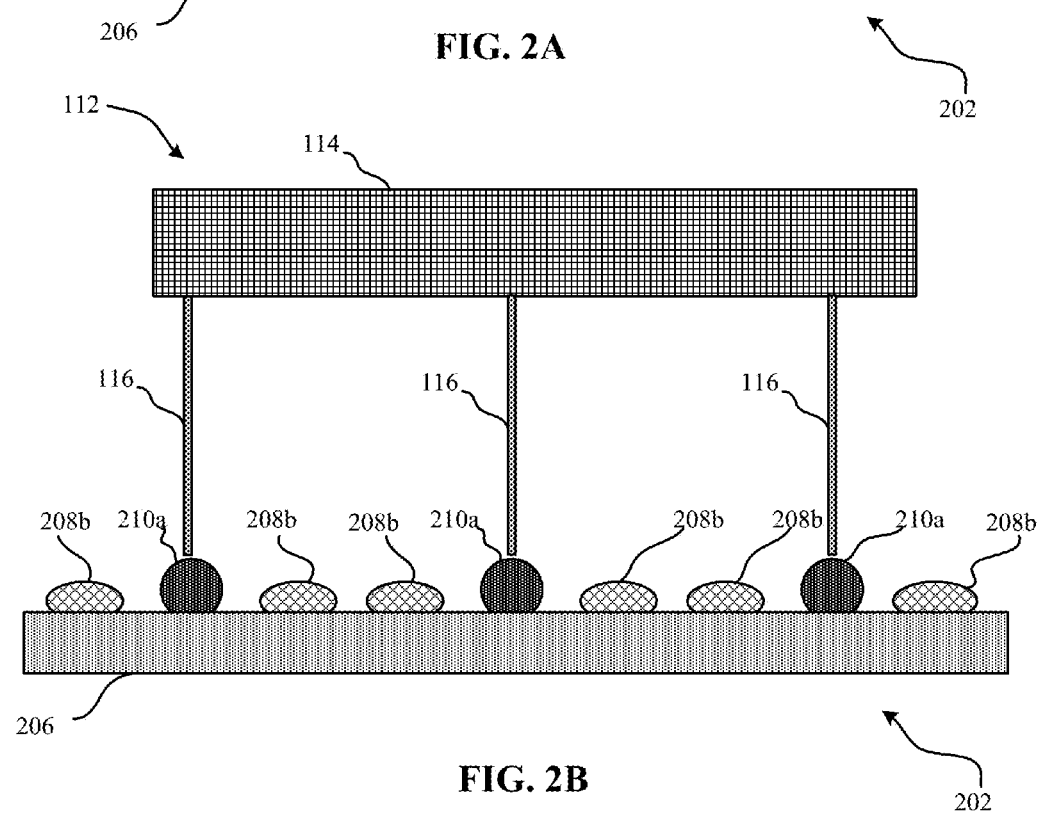
FIG. 2B is a cross-sectional view of the semiconductor chip with the test bumps after the force compressed process according to an embodiment.

FIG. 2B illustrates a cross-sectional view of the semiconductor chip 202 of FIG. 2A after the force compression of the die bumps 208a is completed according to an embodiment. FIG. 2B illustrates the wafer probe 112 that includes a probe substrate 114 and a plurality of probe points 116. Also the semiconductor chip 202 may include the die 206 and the force compressed die bumps, now referenced as 208b, and the test bumps 210a in their original, reflowed, spherical form. Because the test bumps 210a are raised above the level of the adjacent die bumps 208b, less vertical translation of the probe is necessary and shorts are avoided without removing adjacent bumps. After testing is completed, the die bumps 208b and test bumps 210a may be reflowed back to their original, spherical shapes for stacking and mounting.

Figure 3A:
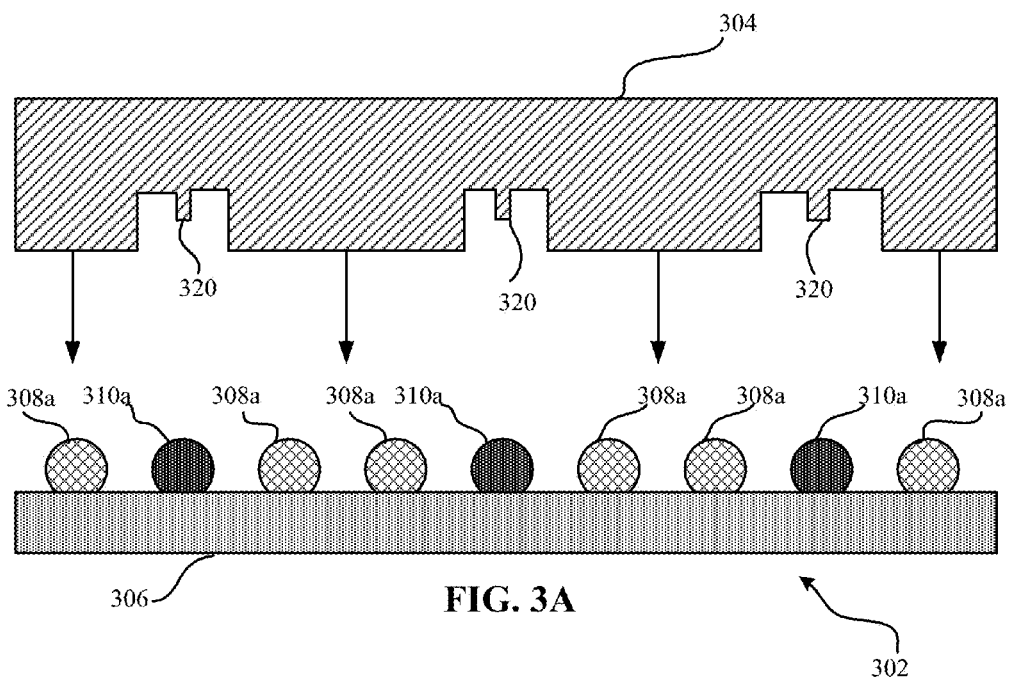
FIG. 3A is a cross-sectional view of the semiconductor chip with reflowed solder bumps utilizing an alternative force compression process to form test bumps according to an embodiment.
Figure 3B:
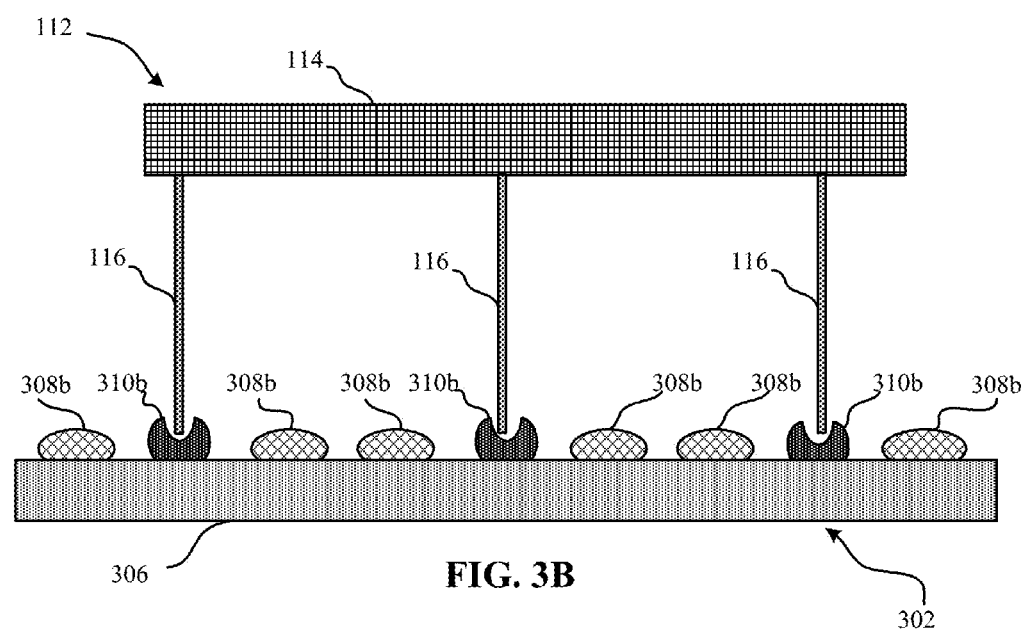
FIG. 3B is a cross-sectional view of the semiconductor chip with the test bumps after the alternative force compression process according to an embodiment.

FIG. 3A illustrates a cross-sectional view of a die 302 of an alternative embodiment of bump force compression. The embodiment may include flat press 304 and a semiconductor chip 302. The flat press 304 may be adapted to compress the all die bumps 308a or specific die bumps adjacent to the test bumps 310a. The flat press 304 may additionally include press points 320 adapted to press a portion of the test bumps 310a. The flat press may alternatively only include the press points 320 for deforming the test bumps so as to not physically alter the die bumps 308a. The test bumps 310a may be deformed forming a bowl shape or concave indentation on the test bumps 310a forming test bump 310b of FIG. 3B. The press points 320 may deform the test bumps 310a so they are shaped to receive the wafer probe points 116 to limit shorting the probe points 116 with the adjacent die bumps 308*b* of FIG. 3B.

Figure 4A:
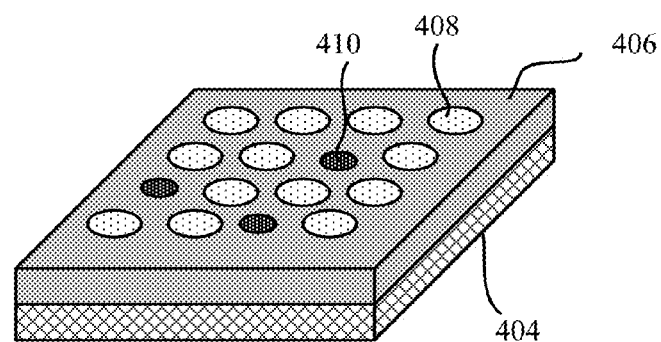
FIG. 4A is an isometric view of the semiconductor chip with mask-shaped test bumps according to an embodiment.

Referring to FIG. 4A, an isometric view of a semiconductor chip 402 utilizing a customized mask for die bump 408 and test bump 410 formation is illustrated according to an embodiment. The semiconductor chip 402 includes a die 404 with a customized mask 406. The customized mask 406 may alter the geometry of certain die bumps 408 and test bumps 410 into a shape, which is more amenable to probing.

Figure 4B:
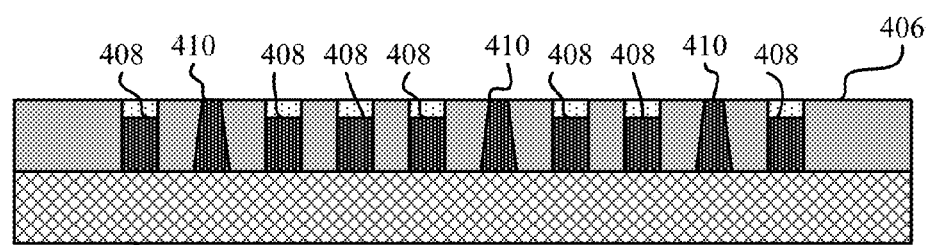
FIG. 4B is a cross-sectional view of the semiconductor chip with mask-shaped test bumps according to an embodiment.

FIG. 4B illustrates a cross-sectional view of the semiconductor chip 402 of FIG. 4A according to an embodiment. The die 404 may include a customized mask 406 on top of the die 404. The mask 406 may include a first geometry to form the die bumps 408 and a second geometry to form the test bumps 410. The die bumps 408 and test bumps 410 may be created with solder or lead-free bump material such as a tin-silver-copper (SAC) alloy by a plating process. Each geometry may be filled with a constant volume of bump material. The die bumps 408 may have a first vertical profile and the test bumps 410 may have a second vertical profile. This may result in the second vertical profile of the test bumps 410 being taller than the first vertical profile of all of the die bumps 408 or the adjacent die bumps 408 due to the geometry of the mask 406. In FIG. 4B, the die bumps 408 may be substantially cylindrical in shape while the test bumps 410 may be in the shape of a conical frustum. However, other shapes are contemplated to differentiate the test bumps 410 from the die bumps 408 to prevent shorting of the wafer probe 112 with the die bumps 408.

Figure 4C:
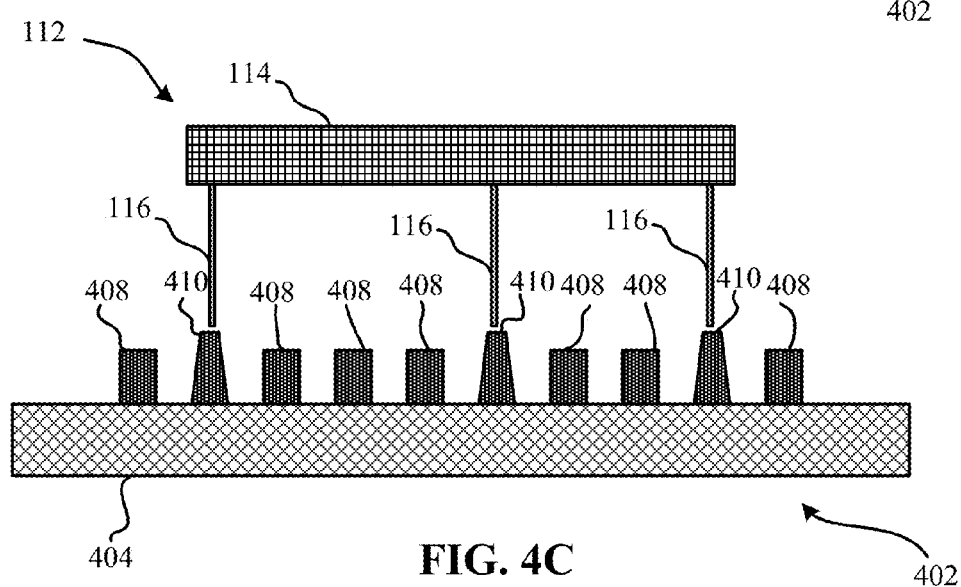
FIG. 4C is a cross-sectional view of the semiconductor chip with the test bumps after the mask is removed according to an embodiment.

FIG. 4C illustrates the semiconductor chip 402 of FIG. 4B after the mask 406 is removed according to an embodiment. The wafer probe 112 may not short with the die bumps 408 during the WFT due to the different geometries or vertical profiles or both of the die bumps 408 and the test bumps 410. The die bumps 408 and the test bumps 410 may be reflowed for stacking or mounting after the WFT.

Figure 5A:
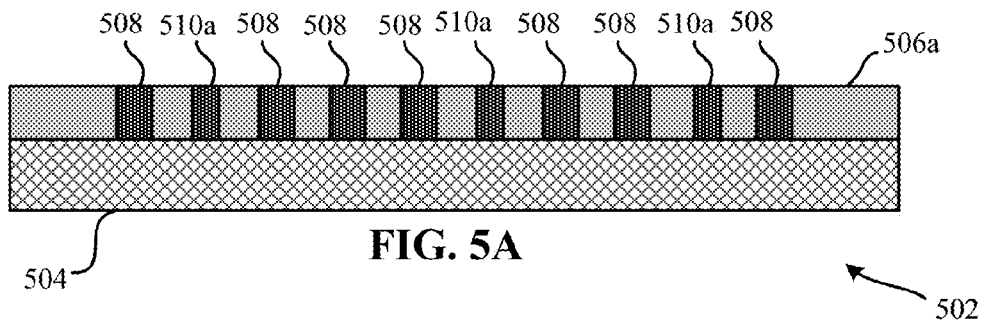
FIGS. 5A-5D show sequential cross-sectional views of the semiconductor chip with test solder bumps utilizing an alternative mask build-up process than FIGS. 4A-4C according to an embodiment.

FIGS. 5A-5D illustrate sequential cross-sectional views of a semiconductor chip during process steps of an alternative masking process for producing die bumps and test bumps according to an embodiment. FIG. 5A illustrates the semiconductor chip 502 that may include a die 504 and a customized mask 506*a* that may have cylindrical openings, for example, for the die bumps 508 and test bumps 510*a*. The openings of the test bumps 510 may have a shorter diameter than the diameter of the die bumps 508. Each of these openings may be filled with a solder compound.

Figure 5B:
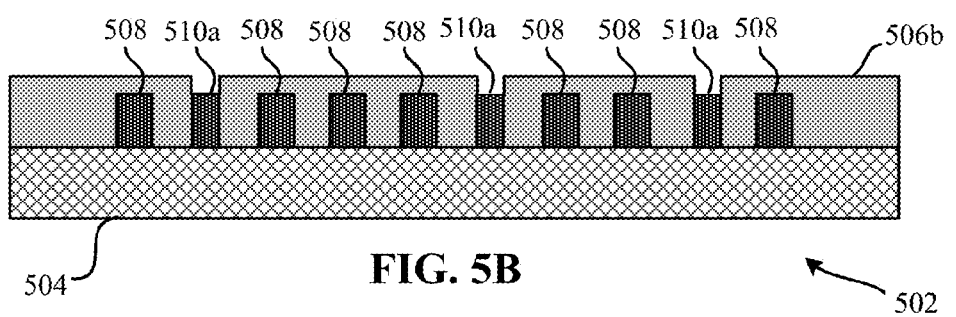
Figure 5C:
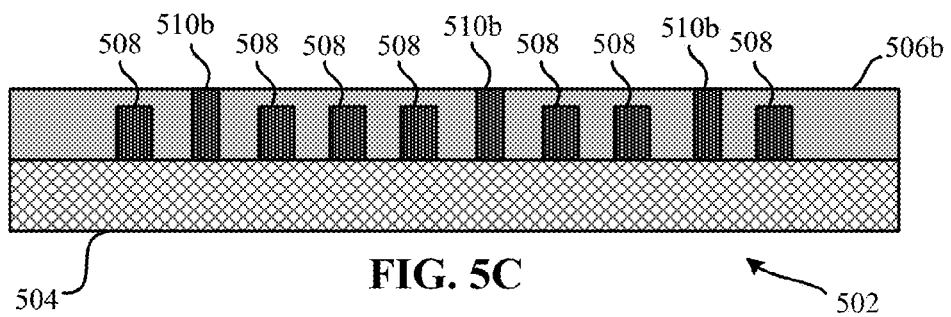
Figure 5D:
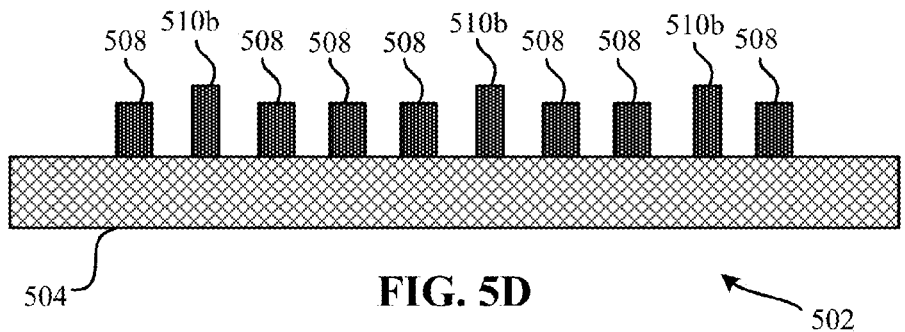

Referring now to FIG. 5B, the die bumps 508 may be masked off and left at their original heights in FIG. 5A creating mask 506*b* according to an embodiment. The test bumps 510*a* may not be masked off by mask 506*b*. Mask 506*b* may be built up to the desired test bump 510*a* height. In FIG. 5C, additional solder plating may be added to the test bumps 510*a* creating test bumps 510*b*. In FIG. 5D, the mask 506*b* may be removed from the semiconductor chip 502 and the WFT may be performed. After the WFT, the test bumps 510*b* and die bumps 508 may be reflowed for stacking or mounting.

Figure 6:
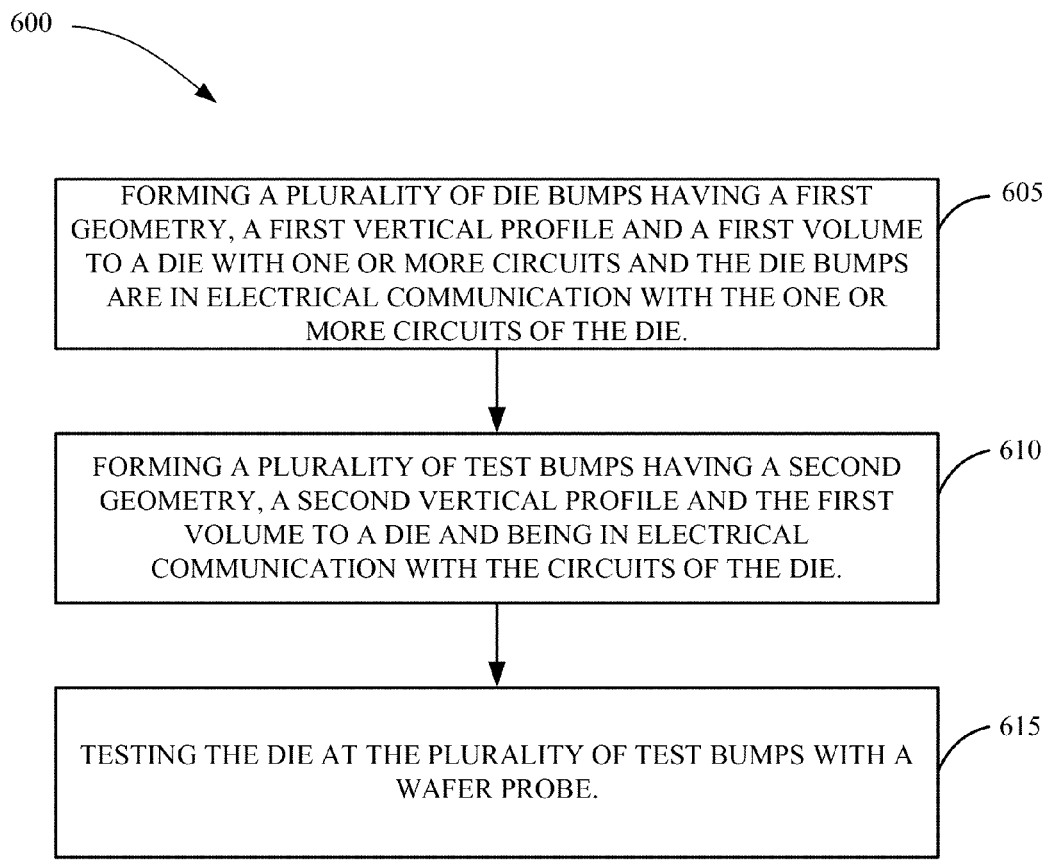
FIG. 6 is a flowchart of a method of testing the die of the semiconductor chip according to an embodiment.

Referring now to FIG. 6, a flow chart of a method 600 for testing the circuits of a semiconductor chip is illustrated, according to an embodiment. In operation 605, a plurality of die bumps may be formed on a die of the semiconductor chip. The die bumps may have a first geometry, a first vertical profile, and a first volume. The die may have one or more integrated circuits and the die bumps may be in electrical communication with the one or more integrated circuits of the die. In operation 610, a plurality of test bumps may be formed on the die of the semiconductor chip. The die bumps may have a second geometry, a second vertical profile, and the first volume of the die bumps or substantially the same volume. The die may have one or more integrated circuits and the test bumps may be in electrical communication with the one or more integrated circuits of the die. Operation 610 may occur before operation 605. Alternatively, both operations may occur simultaneously. In operation 615, the die may be tested with a wafer probe at the plurality of test bumps.

While the invention has been described with reference to the specific aspects thereof, those skilled in the art will be able to make various modifications to the described aspects of the invention without departing from the true spirit and scope of the invention. The terms and descriptions used herein are set forth by way of illustration only and are not meant as limitations. Those skilled in the art will recognize that these and other variations are possible within the spirit and scope of the invention as defined in the following claims and their equivalents.

What is claimed is:

1. A semiconductor chip, comprising:
   a die having one or more circuits;
   a plurality of die bumps, each of the plurality of die bumps having a first geometry, each of the plurality of die bumps further having a first vertical profile, and each of the plurality of die bumps further having a first volume, the plurality of die bumps coupled to the die and in electrical communication with the one or more circuits, the first geometry adapted to prevent a wafer probe from connecting to the plurality of die bumps during a die test; and
   a plurality of test bumps separate from the plurality of die bumps, each of the plurality of test bumps having a second geometry different from the first geometry, each of the plurality of test bumps further having a second vertical profile, and each of the plurality of test bumps further having the first volume, the plurality of test bumps coupled to the die and in electrical communication with the one or more circuits, the second geometry adapted to allow the wafer probe to connect to the plurality of test bumps during the die test.

2. The semiconductor chip of claim 1, wherein the second vertical profile of the test bumps is greater than the first vertical profile of the die bumps.

3. The semiconductor chip of claim 1, wherein the die bumps and the test bumps are made of a material that can be reflowed.

4. The semiconductor chip of claim 3, wherein the material is solder.

5. The semiconductor chip of claim 3, wherein the material is a tin-silver-copper (SAC) alloy.

6. The semiconductor chip of claim 1, wherein the test bumps and the die bumps have substantially the same pitch.

7. A semiconductor chip, comprising:
   a die having one or more circuits;
   a plurality of die bumps, each of the plurality of die bumps having a first geometry, each of the plurality of die bumps further having a first vertical profile, and each of the plurality of die bumps further having a first volume, the plurality of die bumps coupled to the die and in electrical communication with the one or more circuits; and
   a plurality of test bumps separate from the plurality of die bumps, each of the plurality of test bumps having a second geometry different from the first geometry, each of the plurality of test bumps further having a second vertical profile, and each of the plurality of test bumps further having a second volume, the plurality of test bumps coupled to the die and in electrical communication with the one or more circuits, wherein the second vertical profile is greater than the first vertical profile.

8. The semiconductor chip of claim 7, wherein the first geometry and the second geometry are adapted for a wafer probe to make a connection to the test bumps without making a connection to any of the die bumps during a die test.

9. The semiconductor chip of claim 7, wherein the die bumps and the test bumps are made of a material that can be reflowed.

10. The semiconductor chip of claim 9, wherein the material is solder.

11. The semiconductor chip of claim 9, wherein the material is a tin-silver-copper (SAC) alloy.

12. The semiconductor chip of claim 7, wherein the test bumps and the die bumps have substantially the same pitch.

13. The semiconductor chip of claim 7, wherein the first volume and the second volume are substantially equal.

14. A method of testing a die of a semiconductor chip, comprising:
  forming a plurality of die bumps to the die, each of the plurality of die bumps having a first geometry, each of the plurality of die bumps further having a first vertical profile, and each of the plurality of die bumps further having a first volume, the die having one or more circuits, the die bumps in electrical communication with the one or more circuits, the first geometry adapted to prevent a wafer probe from connecting to the plurality of die bumps during a die test;
  forming a plurality of test bumps to the die, the plurality of test bumps separate from the plurality of die bumps, each of the plurality of test bumps having a second geometry, each of the plurality of test bumps further having a second vertical profile, and each of the plurality of test bumps further having the first volume, the test bumps in electrical communication with the one or more circuits, the second geometry adapted to allow the wafer probe to connect to the plurality of test bumps during the die test; and
  testing the die at the plurality of test bumps with the wafer probe.

15. The method of claim 14, further comprising:
  reflowing the test bumps and the die bumps to a third geometry.

16. The method of claim 15, further comprising:
  coupling the semiconductor chip to an external circuit at the test bumps and die bumps.

17. The method of claim 14, wherein the second vertical profile of the test bumps is greater than the vertical profile of the die bumps.

18. The method of claim 14, wherein the forming the plurality of test bumps is completed by a die press process.

19. The method of claim 14, wherein the forming the plurality of test bumps is completed by a force compression process.

* * * * *